(12) United States Patent
Kung et al.

(10) Patent No.: US 12,108,518 B2
(45) Date of Patent: Oct. 1, 2024

(54) HEAT DISSIPATION DESIGN FOR OPTICAL TRANSCEIVER

(71) Applicant: Prime World International Holdings Ltd., New Taipei (TW)

(72) Inventors: Ling-An Kung, New Taipei (TW); Yu Chen, New Taipei (TW); Che-Shou Yeh, New Taipei (TW)

(73) Assignee: Prime World International Holdings Ltd., New Taipei (TW)

( * ) Notice: Subject to any disclaimer, the term of this patent is extended or adjusted under 35 U.S.C. 154(b) by 225 days.

(21) Appl. No.: 17/973,144

(22) Filed: Oct. 25, 2022

(65) Prior Publication Data

US 2024/0138050 A1 Apr. 25, 2024
US 2024/0237187 A9 Jul. 11, 2024

(51) Int. Cl.
*H05K 1/02* (2006.01)
*H04B 10/40* (2013.01)
*H05K 7/20* (2006.01)

(52) U.S. Cl.
CPC .......... *H05K 1/0203* (2013.01); *H04B 10/40* (2013.01); *H05K 7/2039* (2013.01)

(58) Field of Classification Search
CPC .................................................. H05K 7/2039
See application file for complete search history.

(56) References Cited

U.S. PATENT DOCUMENTS

2004/0119603 A1* 6/2004 Bohlander ............... B60Q 3/14
  340/815.45
2020/0060049 A1* 2/2020 Adam .................. H05K 1/0243

\* cited by examiner

*Primary Examiner* — Jerry Wu
(74) *Attorney, Agent, or Firm* — Grossman Tucker Perreault & Pfleger, PLLC

(57) ABSTRACT

An optical transceiver includes a housing, circuit board, first heat source and heat conductive component. The housing includes first and second housing stacked on each other and together form accommodation space. The circuit board is disposed in the accommodation space. The circuit board has first and second surface. The first surface and the second surface face away from each other. The first surface faces the first housing. The second surface faces the second housing. The first heat source is disposed on the second surface of the circuit board and electrically connected to the circuit board. The heat conductive component is disposed on the first surface and thermally coupled to the first housing. Size of projection of the heat conductive component onto the second surface is larger than size of projection of the first heat source onto the second surface.

14 Claims, 5 Drawing Sheets

HEAT DISSIPATION DESIGN FOR OPTICAL TRANSCEIVER

BACKGROUND

1. Technical Field

The present disclosure relates to optical communication, more particularly to heat dissipation design for an optical transceiver.

2. Related Art

Optical transceivers are generally installed in electronic communication facilities in modern high-speed communication networks. In order to make flexible the design of an electronic communication facility and less burdensome the maintenance of the same, an optical transceiver is inserted into a corresponding cage that is disposed in the communication facility in a pluggable manner. In order to define the electrical-to-mechanical interface of the optical transceiver and the corresponding cage, different form factors such as XFP (10 Gigabit Small Form Factor Pluggable) used in 10 GB/s communication rate, QSFP (Quad Small Form-factor Pluggable), or others at different communication rates have been made available.

At present, heat dissipation of an optical communication module in the optical transceiver is usually through housing thereof which further transfers heat to the fins on the cage in which the optical communication module is inserted. Therefore, a proper/efficient heat dissipation path inside the optical transceiver facilitating transfer the heat generated by optical or electronic components to the housing undoubtedly helps overall heat dissipation.

SUMMARY

According to one aspect of the present disclosure, an optical transceiver includes a housing, a circuit board, a first heat source and a heat conductive component. The housing includes a first housing and a second housing that are stacked on each other and together form an accommodation space. The circuit board is disposed in the accommodation space. The circuit board has a first surface and a second surface. The first surface and the second surface face away from each other. The first surface faces the first housing. The second surface faces the second housing. The first heat source is disposed on the second surface of the circuit board and electrically connected to the circuit board. The heat conductive component is disposed on the first surface of the circuit board and thermally coupled to the first housing. A size of a projection of the heat conductive component onto the second surface of the circuit board is larger than a size of a projection of the first heat source onto the second surface of the circuit board.

According to another aspect of the present disclosure, an optical transceiver includes a housing, a circuit board, a first heat source and a heat conductive component. The housing includes a first housing and a second housing that are stacked on each other and together form an accommodation space. The circuit board is disposed in the accommodation space. The circuit board has a first surface, a second surface and at least one through hole. The first surface and the second surface face away from each other. The at least one through hole penetrates through the first surface and the second surface. The first surface faces the first housing. The second surface faces the second housing. The first heat source is disposed on the second surface of the circuit board and electrically connected to the circuit board. The heat conductive component includes a main body, a first protrusion and at least one second protrusion. The main body is thermally coupled to the first housing. The first protrusion and the at least one second protrusion protrude from a side of the main body and are spaced apart from each other. The first protrusion is disposed on the first surface of the circuit board. The at least one second protrusion is located in the at least one through hole and is thermally coupled to the second housing.

BRIEF DESCRIPTION OF THE DRAWINGS

The present disclosure will become more fully understood from the detailed description given below and the accompanying drawings which are given by way of illustration only and thus are not intending to limit the present disclosure and wherein.

DETAILED DESCRIPTION

In the following detailed description, for purposes of explanation, numerous specific details are set forth in order to provide a thorough understanding of the disclosed embodiments. It will be apparent, however, one or more embodiments could be illustrated without these specific details.

Figure 1:
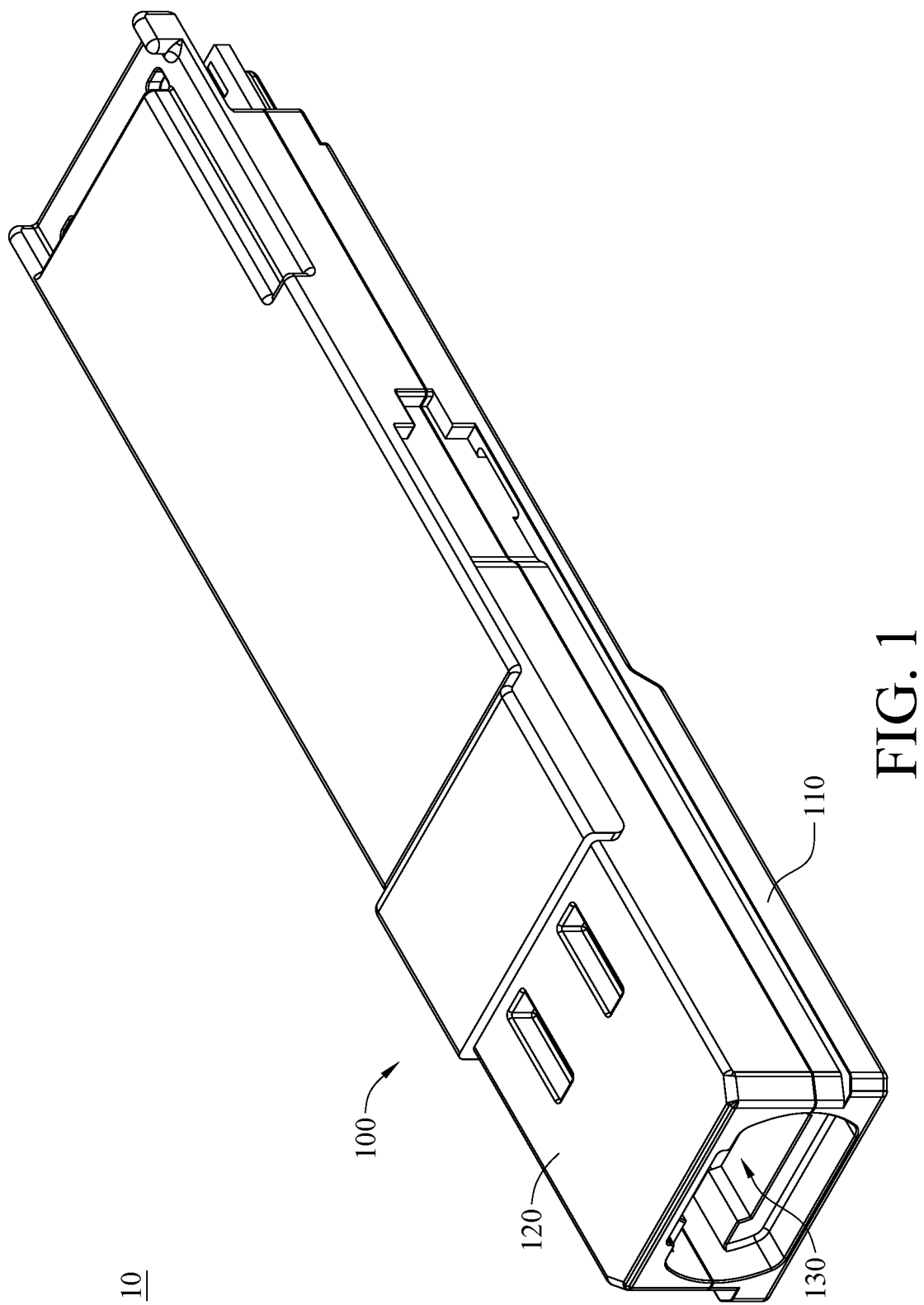
FIG. 1 is a perspective view of an optical transceiver according to one embodiment of the present disclosure.
Figure 2:
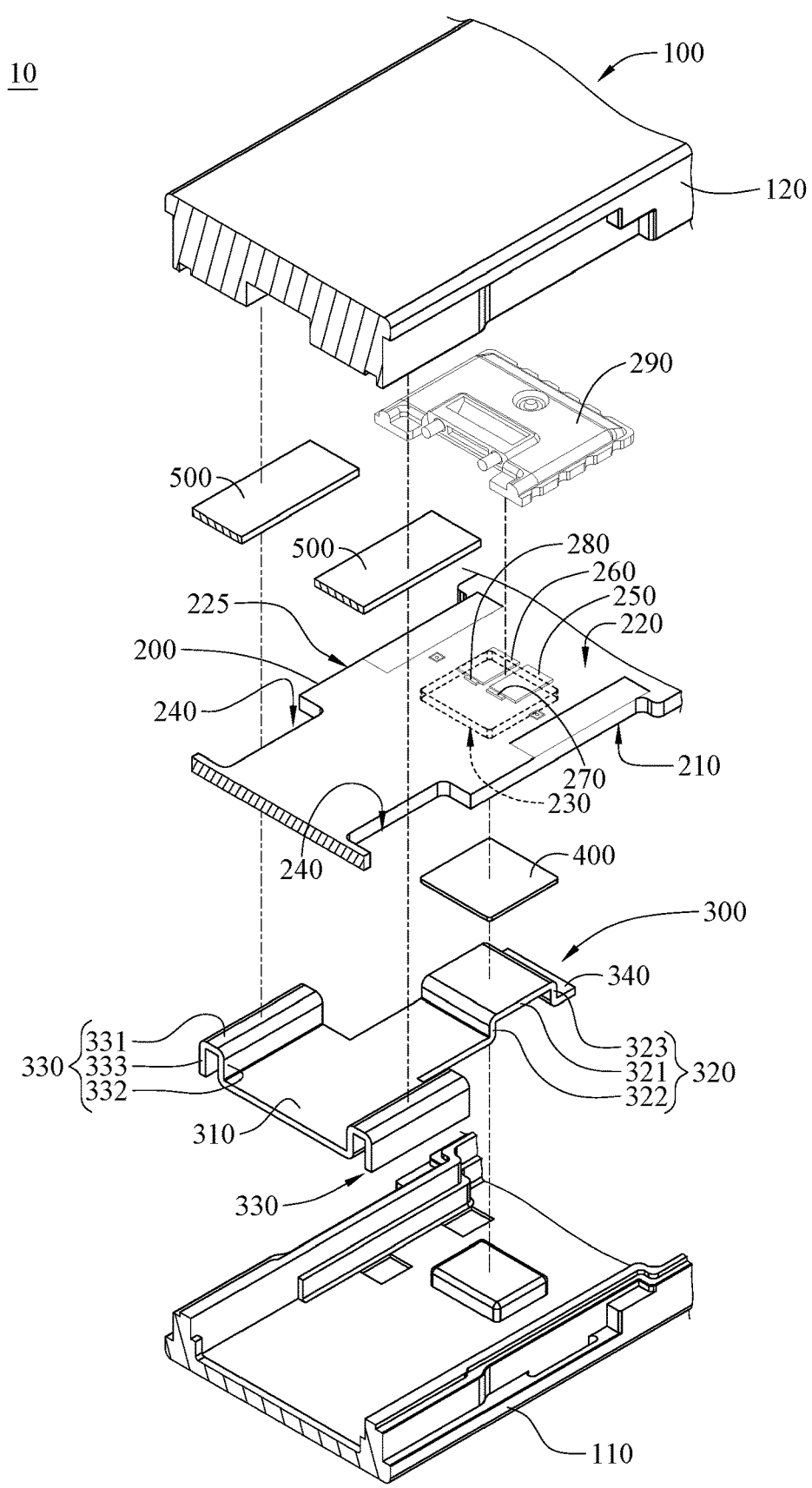
FIG. 2 is a partially enlarged exploded view of the optical transceiver in FIG. 1.
Figure 3:
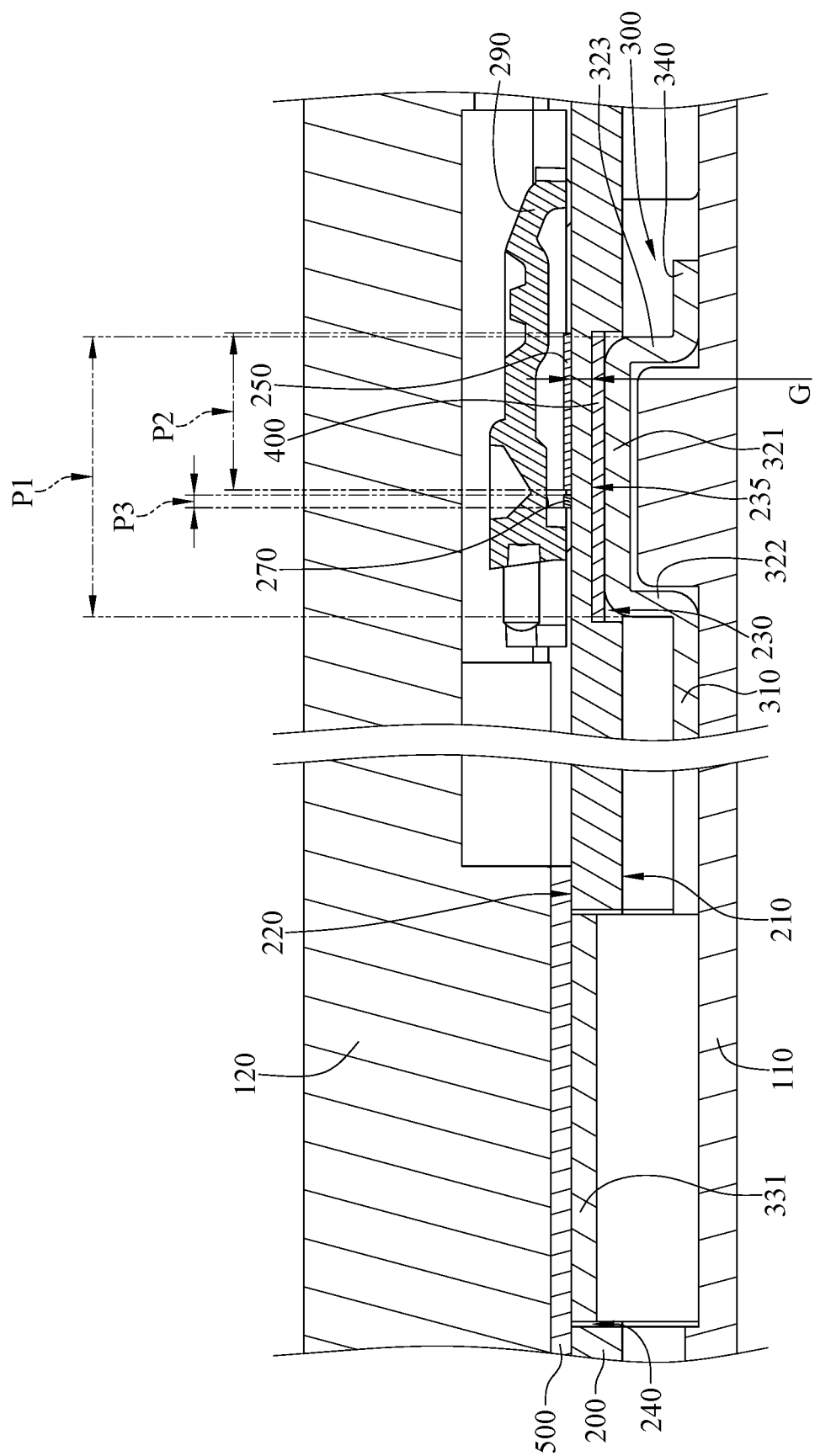
FIG. 3 is a partially enlarged cross-sectional view of the optical transceiver in FIG. 1.

Please refer to FIGS. 1-3. FIG. 1 is a perspective view of an optical transceiver according to one embodiment of the present disclosure. FIG. 2 is a partially enlarged exploded view of the optical transceiver in FIG. 1. FIG. 3 is a partially enlarged cross-sectional view of the optical transceiver in FIG. 1. In this embodiment, an optical transceiver may include a housing 100, a circuit board 200, two first heat sources 250 and 260, two second heat sources 270 and 280, a lens assembly 290, a heat conductive component 300, a first thermal pad 400 and two second thermal pads 500.

The housing 100 may include a first housing 110 and a second housing 120. The first housing 110 and the second housing 120 may be stacked on each other. The first housing 110 and the second housing 120 may together form an accommodation space 130.

The circuit board 200 may be disposed in the accommodation space 130. In this embodiment, the circuit board 200 may have a first surface 210, a second surface 220, a peripheral surface 225, a recess 230, a recessed surface 235, and two through holes 240. The first surface 210 and the second surface 220 may face away from each other. The first surface 210 may face the first housing 110. The second surface 220 may face the second housing 120. The peripheral surface 225 may connect the first surface 210 and the second surface 220. The recess 230 may be formed from the first surface 210. The recessed surface 235 may be a part of the recess 230, and may face away from the second surface 220 (FIG. 3). The two through holes 240 may penetrate through the first surface 210 and the second surface 220. The two through holes 240 may be located on two opposite sides of the peripheral surface 225, respectively. Note that there may be a gap G between the recessed surface 235 and the second surface 220 (FIG. 3), and the gap G may be larger than or equal to 0.4 millimeter to ensure the structural strength of the circuit board 200.

Note that the present disclosure is not limited to the positions of the two through holes 240. In other embodiments, the two through holes may be spaced apart from the peripheral surface of the circuit board.

The two first heat sources 250 and 260 and the two second heat sources 270 and 280 may be disposed on the second surface 220 of the circuit board 200 and may be electrically connected to the circuit board 200. The first heat source 250 may be located closer to the second heat source 270 that the first heat source 260, and the first heat source 260 may be located closer to the second heat source 280 that the first heat source 250. The two first heat sources 250 and 260 and the two second heat sources 270 and 280 may be spaced apart from one another. In this embodiment, the two through holes 240 may be located closer to the second heat sources 270 and 280 than the first heat sources 250 and 260. In this embodiment, the first heat sources 250 and 260 may be light engines, and the second heat sources 270 and 280 may be lasers. The lens assembly 290 may be disposed on the second surface 220 of the circuit board 200 and may cover the first heat sources 250 and 260 and the second heat sources 270 and 280.

The heat conductive component 300 may be disposed within the recess 230 and even on the first surface 210 of the circuit board 200 and thermally coupled to the first housing 110. In detail, in this embodiment, the heat conductive component 300 may include a main body 310, a first protrusion 320, two second protrusions 330 and an extending plate 340. The main body 310 may be in thermal contact with the first housing 110. The first protrusion 320 and the two second protrusions 330 may protrude from a side of the main body 310 facing away from the first housing 110. The first protrusion 320 may be spaced apart from the two second protrusions 330. In this embodiment, the first protrusion 320 may include a base plate 321 and two side plates 322 and 323. The two side plates 322 and 323 may connect the base plate 321 and spaced apart from each other. One side plate 322 may connect the base plate 321 and the main body 310. The base plate 321 may be located in the recess 230. The two second protrusions 330 may be spaced apart from each other. Each second protrusion 330 may include a base plate 331 and two side plates 332 and 333. In each second protrusion 330, the two side plates 332 and 333 may be spaced apart from each other while connecting the base plate 331, with one side plate 332 responsible for connecting the base plate 331 and the main body 310. The two base plates 331 may be located in the two through holes 240, respectively. The extending plate 340 may protrude from a side of the first protrusion 320 that is opposite from the other side of the first protrusion 320 where the second protrusions 330 might be disposed. In this embodiment, the extending plate 340 may protrude from the other one side plate 323 of the first protrusion 320, and may extend along a direction away from the main body 310. The extending plate 340 may effectively increase the heat dissipation area of the heat conductive component 300.

In this embodiment, the heat conductive component 300 may be formed by a stamping process. Thus, the first protrusion 320 may include the base plate 321 and the side plates 322 and 323 standing on the base plate 321, and the second protrusion 330 may include the base plate 331 and the side plates 332 and 333 standing on the base plate 331. In this way, the heat conductive component 300 may have a larger surface area to allow the heat generated by the first heat sources 250 and 260 and the second heat sources 270 and 280 to be quickly transferred to the heat conductive component 300.

In other embodiments, however, the heat conductive component may not include the extending plate 340. Note that the protective scope of the present disclosure is not limited to the shape of the first protrusion 320 and the shape of the second protrusions 330. In other embodiments, the first protrusion and the second protrusion may be in a hemispherical shape.

The first thermal pad 400 may be disposed between the recessed surface 235 and the base plate 321 of the first protrusion 320. In this embodiment, the first thermal pad 400 may be clamped between the recessed surface 235 and the base plate 321 of the first protrusion 320. The two second thermal pads 500 may be disposed between the base plates 331 of the second protrusions 330 and the second housing 120, respectively. In this embodiment, the two second thermal pads 500 may be clamped between the base plates 331 of the second protrusions 330 and the second housing 120, respectively. As such, the base plates 331 of the second protrusions 330 may be thermally coupled to the second housing 120 via the corresponding second thermal pads 500, respectively.

In other embodiments, the optical transceiver may not include the first thermal pad 400 and the base plate of the first protrusion may be in contact with the recessed surface of the circuit board directly. Furthermore, in other embodiments the optical transceiver may not include the second thermal pad 500, allowing for the base plates of the second protrusions to be in thermal contact with the second housing directly.

Note that the present disclosure does not intend to limit the number of the second protrusions. In other embodiments, the heat conductive component may include only one single second protrusion. In such embodiments, the circuit board may have one through hole, and the optical transceiver may have one second thermal pad disposed between the second protrusion and the second housing.

Figure 4:
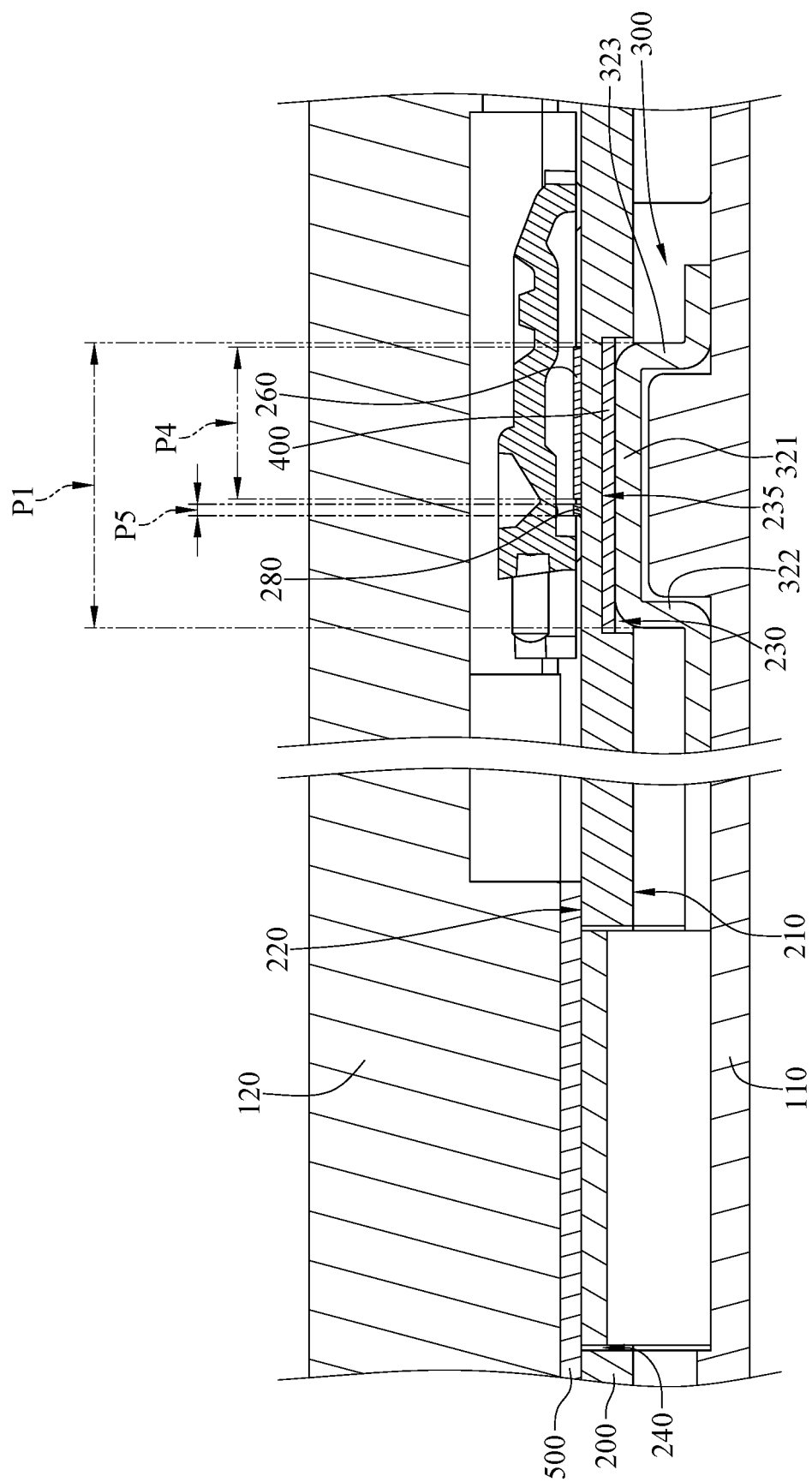
FIG. 4 is another partially enlarged cross-sectional view of the optical transceiver in FIG. 1.
Figure 5:
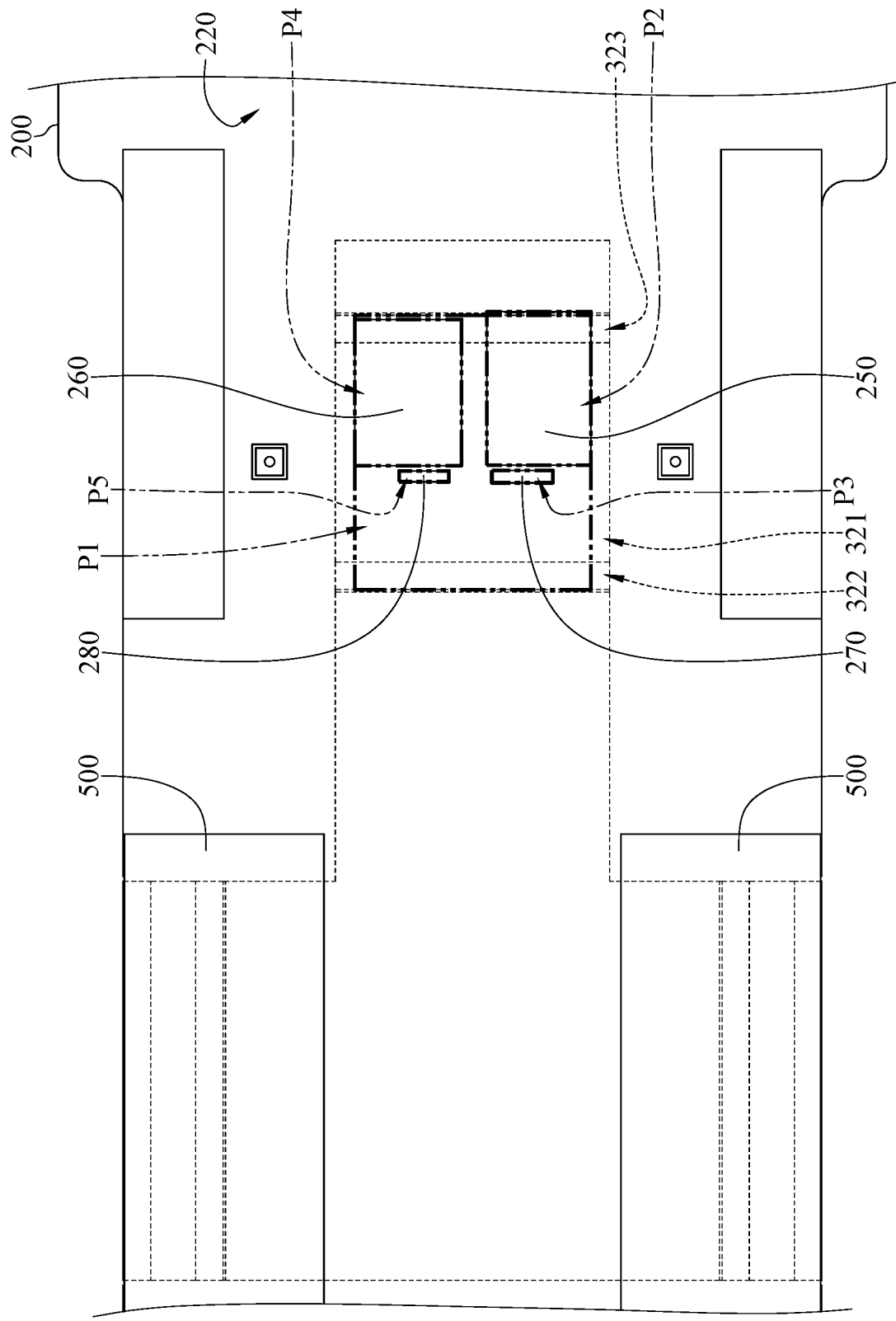
FIG. 5 is a partially enlarged top view of the optical transceiver in FIG. 1 omitting a second housing and a lens assembly.

Please refer to FIGS. 3-5. FIG. 4 is another partially enlarged cross-sectional view of the optical transceiver in FIG. 1. FIG. 5 is a partially enlarged top view of the optical transceiver in FIG. 1 without the second housing and the lens assembly.

In this embodiment, as shown in FIGS. 3 and 5, a size of a projection P1 of the first protrusion 320 of the heat conductive component 300 onto the second surface 220 of the circuit board 200 may be larger than a size of a projection P2 of the first heat source 250 onto the second surface 220 of the circuit board 200. Additionally, a part of the projection P2 of the first heat source 250 may be located inside the projection P1 of the first protrusion 320. In this embodiment, the size of the projection P1 of the first protrusion 320 may be larger than a sum of the size of the projection P2 of the first heat source 250 and a size of a projection P3 of the second heat source 270 onto the second surface 220 of the circuit board 200. Further, the projection P3 of the second heat source 270 may be totally located inside the projection P1 of the first protrusion 320.

In this embodiment, as shown in FIGS. 4 and 5, the size of the projection P1 of the first protrusion 320 may be larger than a size of a projection P4 of the first heat source 260 onto the second surface 220 of the circuit board 200. Additionally, the projection P4 of the first heat source 260 may be totally located inside the projection P1 of the first protrusion 320. In this embodiment, the size of the projection P1 of the first protrusion 320 may be larger than a sum of the size of the projection P4 of the first heat source 260 and a size of a projection P5 of the second heat source 280 onto the second surface 220 of the circuit board 200. Further, the projection P5 of the second heat source 280 may be totally located inside the projection P1 of the first protrusion 320.

Note that in this embodiment, the size of the projection P1 of the first protrusion 320 may be larger than a sum of the size of the projection P2 of the first heat source 250, the size of the projection P3 of the second heat source 270, the size of the projection P4 of the first heat source 260 and the size of a projection P5 of the second heat source 280.

Note that the present disclosure does not intend to limit the numbers of the first heat sources 250 and 260 and the second heat sources 270 and 280. In other embodiments, the optical transceiver may include one first heat source and one second heat source. In other embodiments, the optical transceiver may not include the second heat sources 270 and 280.

Note that circuit board 200 is not limited to have the through holes 240. In other embodiments, when the size of the projection of the heat conductive component onto the second surface of the circuit board may be larger than the size of the projection of the first heat source onto the second surface of the circuit board the circuit board may not have the through holes 240 and the heat conductive component may not include the second protrusions 330.

Note that the present disclosure is not limited by the position relationships between the first heat source 250 and 260 and the heat conductive component 300. In other embodiments, as long as the circuit board may have at least one through hole where at least one second protrusion is located, the size of the projection of the heat conductive component onto the second surface of the circuit board or the projection of the heat conductive component onto the second surface of the circuit board may be equal to or smaller than the size of the projection of at least one first heat source onto the second surface of the circuit board.

According to the optical transceiver disclosed by the above embodiments, the size of the projection of the heat conductive component onto the second surface of the circuit board may be larger than the size of the projection of the first heat source onto the second surface of the circuit board. Thus, less material may be used to made the heat conductive component to allow the heat conductive component to efficiently dissipate the heat generated by the first heat source to the outside via the first housing. That is, the present disclosure may reduce the manufacture cost of the optical transceiver while maintaining the efficiency for the heat generated by the first heat source to be dissipated to the outside via the first housing and the heat conductive component.

In addition, the main body may be thermally coupled to the first housing, and the second protrusion located in the through hole may be thermally coupled to the second housing. Thus, in addition to the first housing, the second housing may also help to dissipate the heat generated by the first heat source to the outside, thereby allowing the heat generated by the first heat source to be quickly dissipated to the outside.

Specifically, according to an experimental result, comparing to the conventional optical transceiver that does not include the heat conductive component but dispose a copper block in the recess of the circuit board, in the optical transceiver according to one embodiment of the present disclosure, the temperature of the first heat source may be decreased from 75.92° C. to 73.95° C., and the temperature of the second heat source may be decreased from 76.18° C. to 74.16° C.

The embodiments are chosen and described in order to best explain the principles of the present disclosure and its practical applications, to thereby enable others skilled in the art to best utilize the present disclosure and various embodiments with various modifications as are suited to the particular use being contemplated. It is intended that the scope of the present disclosure is defined by the following claims and their equivalents.

What is claimed is:

1. An optical transceiver, comprising: a housing, comprising a first housing and a second housing that are stacked on each other and together form an accommodation space; a circuit board, disposed in the accommodation space, wherein the circuit board has a first surface and a second surface, the first surface and the second surface face away from each other, the first surface faces the first housing, and the second surface faces the second housing; a first heat source, disposed on the second surface of the circuit board and electrically connected to the circuit board; and a heat conductive component, disposed on the first surface of the circuit board and thermally coupled to the first housing; wherein, a first area of a projection of the heat conductive component onto the second surface of the circuit board is larger than a second area of a projection of the first heat source onto the second surface of the circuit board; and the circuit board further has a recess, the recess is recessed from the first surface, and the heat conductive component is located in the recess; and the circuit board has at least one through hole penetrating through the first surface and the second surface, the heat conductive component comprises a main body, a first protrusion and at least one second protrusion, the main body is in thermal contact with the first housing, the first protrusion and the second protrusion protrude from a side of the main body and are spaced apart from each other, the first protrusion is located in the recess, and the second protrusion is located in the at least one through hole and thermally coupled to the second housing.

2. The optical transceiver according to claim 1, wherein the projection of the first heat source onto the second surface of the circuit board is totally located inside a projection of the first protrusion of the heat conductive component onto the second surface of the circuit board.

3. The optical transceiver according to claim 1, wherein a part of the projection of the first heat source onto the second surface of the circuit board is located inside a projection of the first protrusion of the heat conductive component onto the second surface of the circuit board.

4. The optical transceiver according to claim 1, wherein the circuit board further has a peripheral surface connecting the first surface and the second surface, and the through hole is located on the peripheral surface.

5. The optical transceiver according to claim 1, wherein the heat conductive component further comprises an extending plate, and the extending plate protrudes from a side of the first protrusion that is opposite from another side of the first protrusion where the second protrusions is disposed.

6. The optical transceiver according to claim 1, further comprising a thermal pad, wherein the circuit board further has a recessed surface, the recessed surface is located in the recess and faces away from the second surface, and the thermal pad is disposed between the recessed surface and the first protrusion.

7. The optical transceiver according to claim 1, further comprising a thermal pad, wherein the thermal pad is disposed between the at least one second protrusion and the second housing.

8. The optical transceiver according to claim 1, wherein the first protrusion of the heat conductive component comprises a base plate and two side plates, the two side plates are spaced apart from each other while connecting the base plate, one of the two side plates connects the base plate and the main body, and the base plate is located in the recess.

9. The optical transceiver according to claim 1, wherein the at least one second protrusion of the heat conductive component comprises a base plate and two side plates, the two side plates stand on a side of the base plate that is located farthest from the second housing and are spaced apart from each other, one of the two side plates connects the base plate and the main body, and the base plate is located in the at least one through hole and thermally coupled to the second housing.

10. The optical transceiver according to claim 1, further comprising a second heat source, wherein the second heat source is disposed on the second surface of the circuit board and electrically connected to the circuit board, the second heat source is spaced apart from the first heat source, and the size of the projection of the heat conductive component onto the second surface of the circuit board is larger than a sum of the size of the projection of the first heat source onto the second surface of the circuit board and a size of a projection of the second heat source onto the second surface of the circuit board.

11. The optical transceiver according to claim 10, wherein the projection of the first heat source onto the second surface of the circuit board and the projection of the second heat source onto the second surface of the circuit board are totally located inside the projection of the heat conductive component onto the second surface of the circuit board.

12. The optical transceiver according to claim 10, wherein the at least one through hole is located closer to the second heat source than the first heat source.

13. The optical transceiver according to claim 4, wherein the at least one second protrusion comprises two second protrusions, the two second protrusions are spaced apart from each other, the at least one through hole comprises two through holes, the two through holes are located on two opposite sides of the peripheral surface, respectively, and the two second protrusions are located in the two through holes, respectively.

14. An optical transceiver, comprising: a housing, comprising a first housing and a second housing that are stacked on each other and together form an accommodation space; a circuit board, disposed in the accommodation space, wherein the circuit board has a first surface, a second surface and at least one through hole, the first surface and the second surface face away from each other, the at least one through hole penetrates through the first surface and the second surface, the first surface faces the first housing, and the second surface faces the second housing; a first heat source, disposed on the second surface of the circuit board and electrically connected to the circuit board; and a heat conductive component, comprising a main body, a first protrusion and at least one second protrusion, wherein the main body is thermally coupled to the first housing, the first protrusion and the at least one second protrusion protrude from a side of the main body and are spaced apart from each other, the first protrusion is disposed on the first surface of the circuit board, and the at least one second protrusion is located in the at least one through hole and thermally coupled to the second housing; and the circuit board further has a recess, the recess is recessed from the first surface, and the heat conductive component is located in the recess; and the circuit board has at least one through hole penetrating through the first surface and the second surface, the heat conductive component comprises a main body, a first protrusion and at least one second protrusion, the main body is in thermal contact with the first housing, the first protrusion and the second protrusion protrude from a side of the main body and are spaced apart from each other, the first protrusion is located in the recess, and the second protrusion is located in the at least one through hole and thermally coupled to the second housing.

* * * * *